US007317642B2

(12) United States Patent
Hirobe (10) Patent No.: US 7,317,642 B2
(45) Date of Patent: Jan. 8, 2008

(54) OVERDRIVE PERIOD CONTROL DEVICE AND OVERDRIVE PERIOD DETERMINING METHOD

(75) Inventor: Atsunori Hirobe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 106 days.

(21) Appl. No.: 11/373,133

(22) Filed: Mar. 13, 2006

(65) Prior Publication Data

US 2006/0203568 A1  Sep. 14, 2006

(30) Foreign Application Priority Data

Mar. 14, 2005  (JP)  ............................. 2005-070955

(51) Int. Cl.
*G11C 7/10* (2006.01)
(52) U.S. Cl. ..................... 365/189.01; 365/189.07; 365/203
(58) Field of Classification Search ........... 365/189.01, 365/189.07, 203, 189.08, 191, 194, 199
See application file for complete search history.

(56) References Cited

U.S. PATENT DOCUMENTS

| 5,319,601 | A | * | 6/1994 | Kawata et al. ............... 365/226 |
| 5,764,580 | A | | 6/1998 | Suzuki et al. |
| 5,831,910 | A | | 11/1998 | Suzuki et al. |
| 6,075,739 | A | * | 6/2000 | Ihara ........................... 365/222 |
| 6,324,111 | B1 | | 11/2001 | Sato et al. |
| 6,392,951 | B2 | | 5/2002 | Fujima et al. |
| 6,592,437 | B1 | | 7/2003 | Boyd et al. |

FOREIGN PATENT DOCUMENTS

| JP | 05-062467 | 3/1993 |
| JP | 09-120675 | 5/1997 |
| JP | 10-269771 | 10/1998 |
| JP | 10-242815 | 11/1998 |
| JP | 11-273346 | 10/1999 |
| JP | 2001-035164 A | 2/2001 |
| JP | 2001-266573 A | 9/2001 |
| JP | 2002-334577 A | 11/2002 |
| JP | 2002-358778 A | 12/2002 |
| JP | 2003-085972 A | 3/2003 |
| JP | 2003-141876 A | 5/2003 |

* cited by examiner

*Primary Examiner*—Son Dinh
*Assistant Examiner*—Dang Nguyen
(74) *Attorney, Agent, or Firm*—Foley & Lardner LLP

(57) ABSTRACT

An overdrive period control device includes a pre-charge circuit connected to a node on which a potential is detected and for raising a potential at the node to a first potential; a delay element one terminal of which is connected to the node; a charge circuit supplying a power source voltage to the other terminal of the delay element at the input timing of a signal from the outside and raising the potential at the node to the power source voltage; and a comparison circuit comparing the potential at the node with a reference potential and detecting the timing at which both levels of the potentials coincide. The device outputs a signal indicating a period determined by the input timing of the signal from the outside and the timing in which the comparison circuit detects that the levels coincide.

8 Claims, 9 Drawing Sheets

OVERDRIVE PERIOD CONTROL DEVICE AND OVERDRIVE PERIOD DETERMINING METHOD

BACKGROUND OF THE INVENTION (1) Field of the Invention

The present invention relates to a device and a method for determining an overdrive period used in a semiconductor device. For example, it is applied to a sense amplifier circuit in a semiconductor memory device like DRAM (Dynamic Random Access Memory).

(2) Description of the Related Art

Densities of DRAMs are increased, and memory capacities are further increased. In this state, it is necessary for DRAM to enhance speed and to reduce power consumption.

By driving DRAM at a low voltage, reduction in power consumption can be attained. However, when DRAM is driven at the low voltage, there arises a problem where the amplifying rate of the sense amplifier becomes slow and the operating rate of DRAM is slowed down. An overdrive technique has been proposed as a technique for operating the sense amplifier at a low voltage and at high speed. The overdrive technique is that, for example, a high voltage (such as power source voltage $V_{DD}$) is temporarily applied to a common driving line in the sense amplifier to enhance the current driving capability of MOS, thereby making the amplifying operation of the sense amplifier faster.

However, in the method that carries out the amplifying operation in the sense amplifier at high speed according to the above-described overdrive technique, the following problems arise depending on the setting of the overdrive period, namely, the period for which power source voltage $V_{DD}$ is applied.

For example, in a case of performing an overdrive in which, after applying external power source voltage $V_{DD}$ to the common driving line in the sense amplifier, dropped voltage (internal voltage) $V_{DL}$ ($<V_{DD}$), namely, the dropped external power source voltage is applied to the common driving line; when the overdrive period is long, excessive overdrive is performed and the internal power source voltage for the array exceeds dropped voltage $V_{DL}$ to cause an excessive boost. To the contrary, when the overdrive period is short, no sufficient overdrive is performed. Accordingly, there is a problem that timing to make a p-channel MOS transistor (or n-channel MOS transistor) in the sense amplifier ON is delayed and data in a memory cell cannot be read accurately.

Therefore, the overdrive period control device capable of preventing excessive overdrive has been proposed (refer to Japanese Patent Laid-Open Nos. 9-120675 and 10-242815). The control device is provided with an inverter using external power source voltage $V_{DD}$ as an operating voltage as delay means for specifying the overdrive period. The inverter has the property in which the higher the operating voltage is, the shorter the transient response characteristic is. According to this inverter property, when external power source voltage $V_{DD}$ is high, the overdrive period is short and, on the contrary, when external power source voltage $V_{DD}$ is low, the overdrive period is long. Control of the overdrive period using the inverter property in this way prevents excessive overdrive.

However, the following problems arise in the conventional overdrive period control device described in Japanese Patent Laid-Open Nos. 9-120675 and 10-242815.

Generally, the operating range of general-purpose DRAM is set to 3.3V±0.3V for a power source voltage of 3.3V and to 5V±0.5V for a power source voltage of 5V. Therefore, preferably, the characteristic of the overdrive period control device, specifically, the adjustment range of the overdrive period using the inverter property is set within the operating range thereof, as appropriate, however, such a adjustment function have not been provided yet. Usually, the inverter property is set so that the overdrive period can be sufficiently controlled at the low side of power source voltage $V_{DD}$ within the operating range of a product. In DRAM that is set like this, at the high side of power source voltage $V_{DD}$ within the operating range, the adjustment range of the overdrive period using the inverter property is small. Therefore, there are some cases where the overdrive period is not adjusted sufficiently.

As described above, the conventional overdrive period control device has a problem in that the overdrive period cannot be adjusted sufficiently depending on setting of the inverter property because the inverter property is dependent on the power source voltage. To improve general versatility, it is desirable that the overdrive period can be sufficiently adjusted over the operating range of the product.

Further, when the driving voltage for the inverter is set as another power source voltage separately from the external power source voltage, namely, the second internal power source voltage which is the dropped external power source and is different from dropped voltage $V_{DL}$, the control range of the overdrive period can be maintained constant regardless of the external power source voltage. However, it is difficult to provide a circuit for generating the second internal power source voltage like this in DRAM that will have improved designs and lower driving voltages recently.

The above and other objects, features, and advantages of the present invention will become apparent from the following description with reference to the accompanying drawings which illustrate examples of the present invention.

SUMMARY OF THE INVENTION

An object of the present invention is to provide an overdrive period control device and an overdrive period determining method, which can solve the above-mentioned problems and is capable of adjusting an overdrive period sufficiently over an operating range of a product.

To achieve the above-described object, the first form of the present invention comprises: a pre-charge circuit connected to a node on which a potential level is detected and for raising a potential at the node to a first potential; a delay element one terminal of which is connected to the node; a charge circuit for supplying a power source voltage to the other terminal of said delay element at the input timing of a signal from the outside and for raising the potential at the node, which has been raised to the first potential, to the power source voltage; a comparison circuit for comparing the potential at the node with a reference potential that is larger than the first potential and smaller than the power source voltage and for detecting the timing in which both levels of the potentials coincide; and a logic circuit outputting a signal indicating a period determined by the input timing of the signal from the outside and the timing in which said comparison circuit detects that both levels of the potentials coincide.

In the above-described configuration, the period determined by the input timing and the timing in which the comparison circuit detects that the levels are coincided is set as the overdrive period. The overdrive period corresponds to the time required until the potential at the node, which is raised to the first potential, reaches the reference potential.

The required times is equal to the delay time generated by the delay element. When the power source voltage is high, the overdrive period is short, and when the power source voltage is low, the overdrive period is long. In this way, the power source voltage and the overdrive period are in an inverse proportional relationship. With this inverse proportional relationship, it is possible to carry out the operation similar to the adjustment of the overdrive period based on the above-described inverter property.

Additionally, by changing the setting value of the reference potential, the overdrive period adjusted using the inverse proportional relationship can be further adjusted. For example, when the setting value of the reference potential is set larger, the overdrive period can be set longer. On the other hand, when the setting value of the reference potential is set smaller, the overdrive period can be set shorter. By combining the adjustment by using the reference potential together with adjustment using the inverse proportional relationship, the adjustment range of the overdrive period is still larger than the adjustment range using the inverter property. Accordingly, sufficient adjustment can be provided over the operating range of the product.

Also, the overdrive period can be adjusted by making the first potential variable, similarly to the adjustment by the reference potential.

The second form of the present invention comprises: a pre-charge circuit for supplying a power source voltage to a node on which a potential level is detected and for raising a potential at the node to the power source voltage; a delay element one terminal of which is connected to the node; a discharge circuit for supplying a second potential to the other terminal of said delay element at the input timing of a signal from the outside and for lowering the potential at the node, which has been raised to the power source voltage, to the second potential; a comparison circuit for comparing the potential at the node with a reference potential that is larger than the second potential and smaller than the power source voltage and for detecting the timing at which both levels of the potentials coincide; and a logic circuit for outputting a signal indicating a period determined by the input timing of the signal from the outside and the timing in which said comparison circuit detects that both levels of the potential coincide.

According to the above-described configuration, the period determined by the input timing and the timing in which the comparison circuit detects that the levels are coincided is set as the overdrive period. The overdrive period corresponds to the time required until the potential at the node, which is raised to the power source voltage, reaches the reference potential (equal to the delay time generated by the delay element). When the power source voltage is high, the overdrive period is long, and when the power source voltage is low, the overdrive period is short. In this way, the power source voltage and the overdrive period are in a proportional relationship. With this proportional relationship, it is possible to carry out the adjustment operation inversely to the first aspect.

Additionally, by changing the value for setting the reference potential, the overdrive period adjusted using the proportional relationship can be further adjusted. For example, when the value for setting the reference potential is set larger, the overdrive period can be set shorter. On the other hand, when the value for setting the reference potential is set smaller, the overdrive period can be set longer. By combining the adjustment by using the reference potential together with the adjustment using the proportional relationship, the adjustment range of the overdrive period is still larger than the adjustment range using the inverter property. Accordingly, sufficient adjustment can be provided over the operating range of the product.

Also, the overdrive period can be adjusted by making the second potential variable, similarly to the adjustment by the reference potential.

The third form of the present invention comprises: a first pre-charge circuit connected to a first node on which a potential level is detected and for raising a potential at the first node to a first potential; a first delay element one terminal of which is connected to the first node; a charge circuit for supplying a power source voltage to the other terminal of said first delay element at the input timing of a signal from the outside and for raising the potential at the first node, which has been already raised to the first potential, to the power source voltage; a first comparison circuit for comparing the potential at the first node with a first reference potential that is larger than the first potential and smaller than the power source voltage and for detecting a first timing at which both levels of the potentials are coincide; a second pre-charge circuit for supplying the power source voltage to a second node on which a potential level is detected and for raising a potential at the second node to the power source voltage; a second delay element of which one terminal is connected to the second node; a discharge circuit for supplying a second potential to the other terminal of said second delay element at the input timing of the signal from the outside and for lowering the potential at the second node, which has been already raised to the power source voltage, to the second potential; a second comparison circuit comparing the potential at the second node with a second reference potential that is larger than the second potential and smaller than the power source voltage and for detecting a second timing at which both levels of the potentials are coincide; and a logic circuit for outputting a signal indicating a period determined by subtracting a second period, which is determined by the input timing of the signal from the outside and the second timing, from a first period which is determined by the input timing of the signal from the outside and by the first timing.

In the above-described configuration, respective advantages in the first and the second aspects can be used, and thus the adjustment range of the overdrive period can be further increased.

As explained above, according to the present invention, not only the overdrive period is adjusted using the inverse proportional relationship or the proportional relationship between the overdrive period and the power source voltage, but also the overdrive period is adjusted by the reference potential or the first and second potentials. Therefore, the adjustment range of the overdrive period is still larger than that using the conventional inverter property. According to the adjustment range of the overdrive period according to the present invention, the overdrive period can be adjusted sufficiently over the operating range of the product.

DETAILED DESCRIPTION OF THE PREFERRED EMBODIMENTS

First Embodiment

Figure 1:
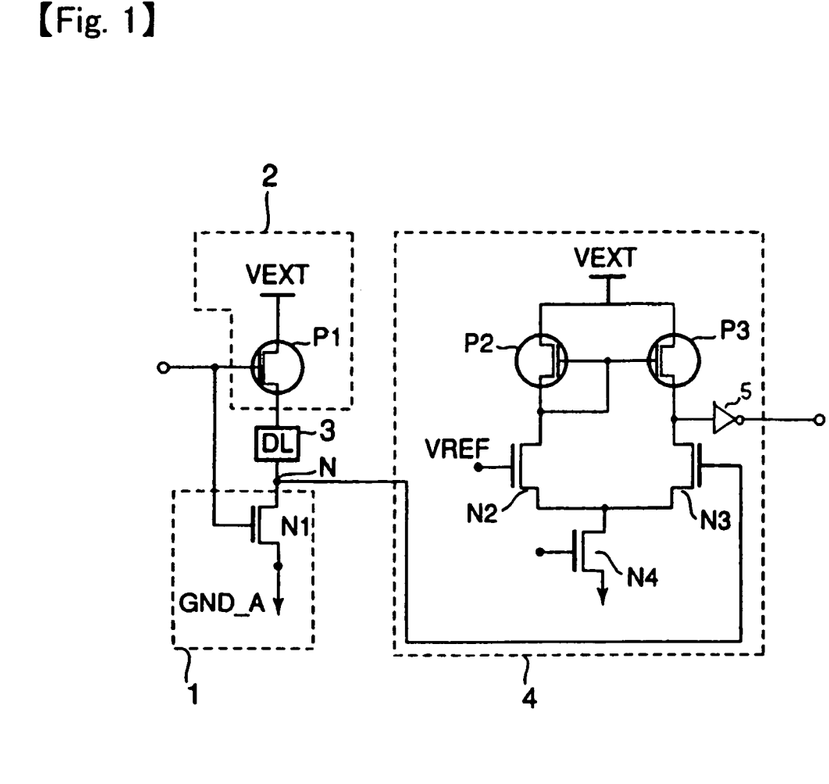
FIG. 1 is a block diagram showing a schematic configuration of a delay timer in an overdrive period control device according to a first embodiment of the present invention.

FIG. 1 is a block diagram showing a schematic configuration of a delay timer in an overdrive period control device according to a first embodiment of the present invention. Referring to FIG. 1, a delay timer is used in a semiconductor memory, in particular, a sense amplifier circuit of DRAM that adopts the overdrive system, and is provided with pre-charge circuit 1, charge circuit 2, delay element 3, and comparison circuit 4, as elements for determining the overdrive period.

Pre-charge circuit 1 includes n-channel MOS transistor N1 in which node N which is to be a detection position of a potential level is connected to one terminal and first potential GND_A is supplied to the other terminal. Timing signal T is supplied to the gate of n-channel MOS transistor N1.

Charge circuit 2 is able to charge delay element 3 up to external power source voltage $V_{EXT}$ and includes p-channel MOS transistor P1 in which node N is connected to one terminal via delay element 3 and external power source voltage $V_{EXT}$ is supplied to the other terminal. Timing signal T is also supplied to the gate of p-channel MOS transistor P1.

Figure 2:
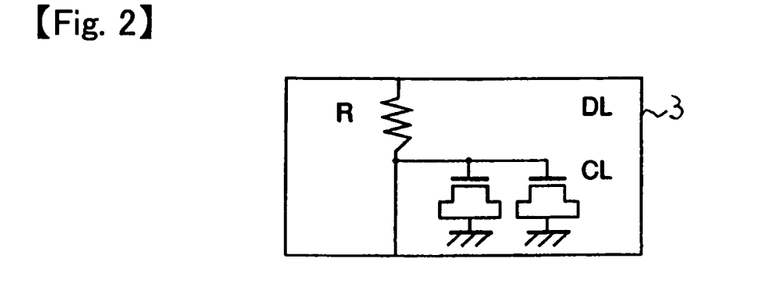
FIG. 2 is a circuit diagram showing one example of a delay element in the delay timer shown in FIG. 1.

Delay element 3 includes a time constant circuit having a resistance and a capacitance. FIG. 2 shows one example of the time constant circuit. As shown in FIG. 2, the time constant circuit includes resistance R in which one terminal is connected to one terminal of p-channel MOS transistor P1 and the other terminal is connected to node N and two capacitance elements (transistors in this embodiment) CL connected to the other terminal of resistance R in parallel. The time for charging delay element 3 up to external power source voltage $V_{EXT}$ can be calculated using the time constant.

Comparison circuit 4 is a current mirror circuit for comparing potential $V_N$ at node N with reference potential $V_{REF}$, and includes two p-channel MOS transistors P2, P3 in which external power source voltage $V_{EXT}$ is supplied to one terminal, n-channel MOS transistors N2 of which one terminal is connected to the other terminal of p-channel MOS transistors P2, n-channel MOS transistors N3 of which one terminal is connected to the other terminal of p-channel MOS transistors P3, and n-channel MOS transistors N4 in which both the other terminals of n-channel MOS transistors N2, N3 are connected one terminal and the ground potential is supplied to the other terminal. Reference potential $V_{REF}$ is supplied to a gate of n-channel MOS transistors N2. Each gate of p-channel MOS transistors P2, P3 is connected to a node of one terminal of p-channel MOS transistor P2 and one terminal of n-channel MOS transistors N2. A line connected to a node of the other terminal of p-channel MOS transistor P3 and the other terminal of n-channel MOS transistor N3 is an output line of comparison circuit 4. Inverter 5 is interposed in series with the output line. In comparison circuit 4, an output signal is changed to a high-level state at the timing where potential $V_N$ reaches reference potential $V_{REF}$.

In the above-described delay timer, during period H in which timing signal T is at the high level, n-channel MOS transistor N1 is ON and p-channel MOS transistor P1 is OFF. When n-channel MOS transistor N1 is ON, node N is pre-charged to first potential GND_A. On the other hand, during period L in which timing signal T is at the low level, n-channel MOS transistor N1 is OFF and p-channel MOS transistor P1 is ON. When p-channel MOS transistor P1 is ON, delay element 3 starts to charge and potential $V_N$ at node N rises gradually. When potential $V_N$ at node N reaches reference potential $V_{REF}$, n-channel MOS transistor N3 is ON and the output from comparison circuit 4 is changed from the low level to the high level.

The overdrive period control device according to the first embodiment is characterized in that the overdrive period is determined by the above-described delay timer.

Figure 3A:
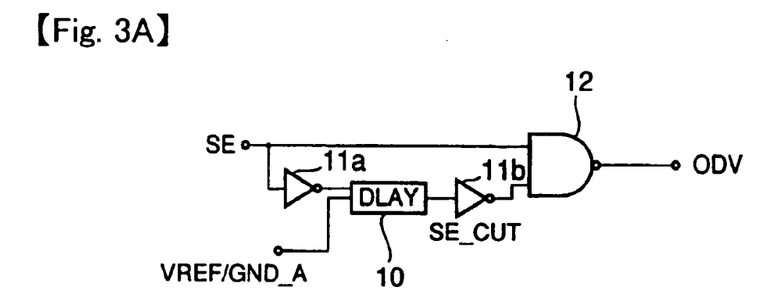
FIG. 3A is a circuit diagram showing a first example of the overdrive period control device according to the first embodiment of the present invention.

FIG. 3A shows a first example of the overdrive period control device according to the first embodiment of the present invention. The overdrive period control device shown in FIG. 3A uses timing signal SE as an input to start the sense amplifier circuit in DRAM. Timing signal SE is supplied to delay timer 10 via logic circuit (NOT) 11a and is also supplied to one input of logic circuit (NAND) 12. Output signal SE_CUT from delay timer 10 is supplied to the other input of logic circuit (NAND) 12 via logic circuit (NOT) 11b. Delay timer 10 is configured similarly to that shown in FIG. 1. The output from logic circuit (NAND) 12 is overdrive signal ODV.

Figure 3B:
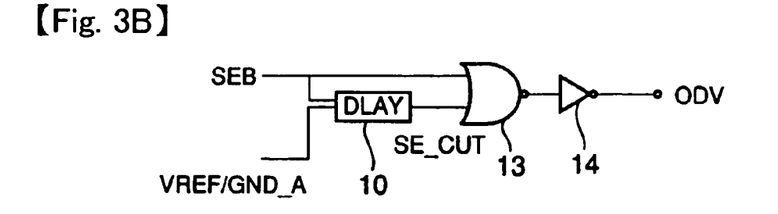
FIG. 3B is a circuit diagram showing a second example of the overdrive period control device according to the first embodiment of the present invention.

FIG. 3B shows a second example of the overdrive period control device according to the first embodiment of the present invention. The overdrive period control device shown in FIG. 3B uses inverse signal SEB of timing signal SE as an input. Inverse signal SEB is supplied to one input of delay timer 10 and to one input of logic circuit (NOR) 13. Output signal SE_CUT from delay timer 10 is supplied to the other input of logic circuit (NOR) 13. The output from logic circuit (NOR) 13 is supplied to the input of logic circuit (NOT) 14. The output from logic circuit (NOT) 14 is overdrive signal ODV.

Figure 4:
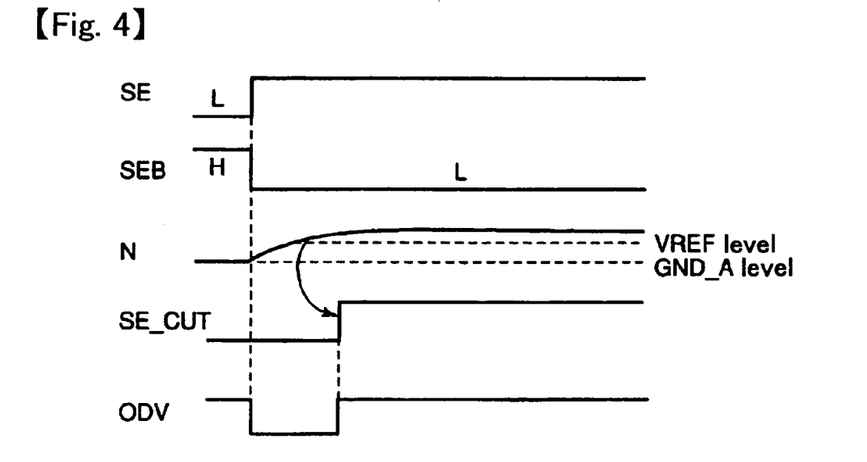
FIG. 4 is a timing chart showing an operation of the overdrive period control device according to the first embodiment of the present invention.

The operation of the overdrive period control device shown in FIG. 3A is similar to that shown in FIG. 3B. FIG. 4 is a timing chart showing the operation. The operation of the overdrive period control device is explained below with reference to FIGS. 1, 3, and 4.

Inverse signal SEB (timing signal T) of timing signal SE is supplied to delay timer 10. In delay timer 10, while inverse signal SEB is at the high level, n-channel MOS transistor N1 is ON and p-channel MOS transistor P1 is OFF. When n-channel MOS transistor N1 is ON, node N is pre-charged to first potential GND_A, for example, voltage $HV_{CC}$ which is one half of memory cell array power source voltage $V_{DL}$ in DRAM. FIG. 4 shows a state in that potential $V_N$ at node N reaches first potential GND_A.

Since n-channel MOS transistor N3 is OFF while inverse signal SEB is at the high level, the output from comparison circuit 4, namely, output signal SE_CUT from delay timer 10 is at the low level. Further, since both timing signal SE and output signal SE_CUT are at the low level, overdrive signal ODV is at the high level.

When inverse signal SEB is changed from the high level to the low level, n-channel MOS transistor N1 is OFF and p-channel MOS transistor P1 is ON. When p-channel MOS transistor P1 is ON, potential $V_N$ at node N rises from first potential GND_A and then reaches reference potential $V_{REF}$.

Since n-channel MOS transistor N3 is OFF during the period until potential $V_N$ at node N reaches reference potential $V_{REF}$, the output (output signal SE_CUT) from comparison circuit 4 is at the low level. Also, since timing signal SE is at the high level and output signal SE_CUT is at the low level during this period, overdrive signal ODV is at the low level.

When potential $V_N$ at node N reaches reference potential $V_{REF}$, n-channel MOS transistor N3 is ON and the output (output signal SE_CUT) from comparison circuit 4 is changed from the low level to the high level. When output signal SE_CUT is at the high level, overdrive signal ODV changes from the low level to the high level.

Figure 5:
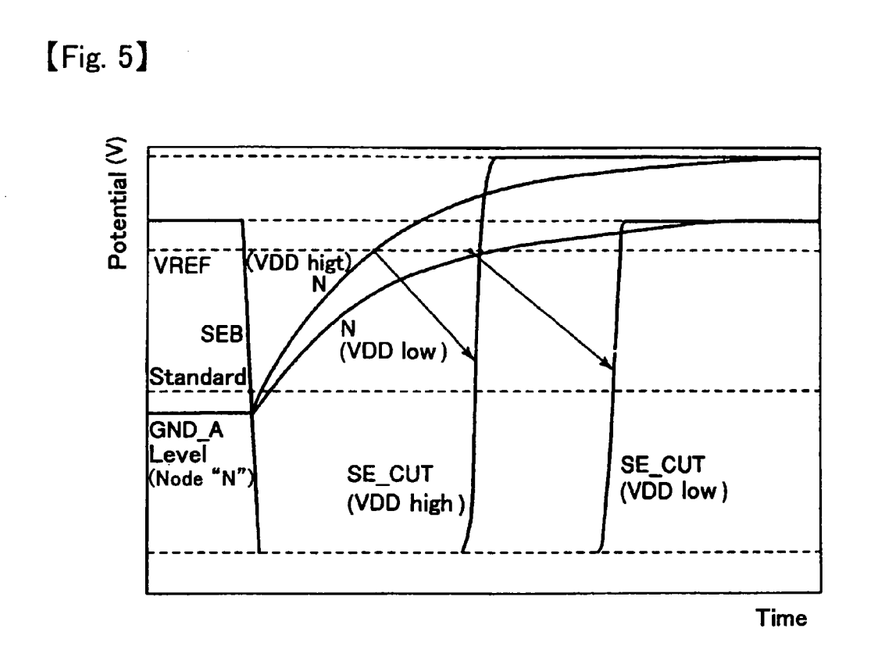
FIG. 5 is a chart showing operational waveforms in the overdrive period control device according to the first embodiment of the present invention.

FIG. 5 shows operational waveforms of the overdrive period control device according to the first embodiment. The vertical axis indicates a potential and the horizontal axis indicates a time. In FIG. 5, the change of potential at node N and output signal SE_CUT, in a case where external power source voltage $V_{DD}$ is high, and the change of potential at node N and output signal SE_CUT, in a case where external power source voltage $V_{DD}$ is low, are shown. As is apparent from the operation waveforms in FIG. 5, when external power source voltage $V_{DD}$ is high, the potential at node N reaches reference potential $V_{REF}$ faster than the case where external power source voltage $V_{DD}$ is low. Therefore, the rising edge of output signal SE_CUT in the case where external power source voltage $V_{DD}$ is high occurs earlier than that in the case where external power source voltage $V_{DD}$ is low. Accordingly, the overdrive period in the case where external power source voltage $V_{DD}$ is high is shorter than that in the case where external power source voltage $V_{DD}$ is low.

As is apparent from the above description, when external power source voltage $V_{DD}$ is high, the overdrive period (the period in which overdrive signal ODV is at the low level in FIG. 4) is short, and when external power source voltage $V_{DD}$ is low, the overdrive period is long. The external power source voltage and the overdrive period are in an inverse proportional relationship. This inverse proportional relationship is called inverse dependency of the overdrive period on the external power source voltage. With this inverse dependency, it is possible to carry out the operation similar to the conventional adjustment of the overdrive period using the inverter property.

According to the overdrive period control device of the first embodiment, by changing the value for setting reference potential $V_{REF}$, the inverse dependency of the overdrive period on the external power source voltage can be adjusted. Also, by varying first potential GND_A, the inverse dependency of the overdrive period on the external power source voltage can be adjusted.

Figure 6:
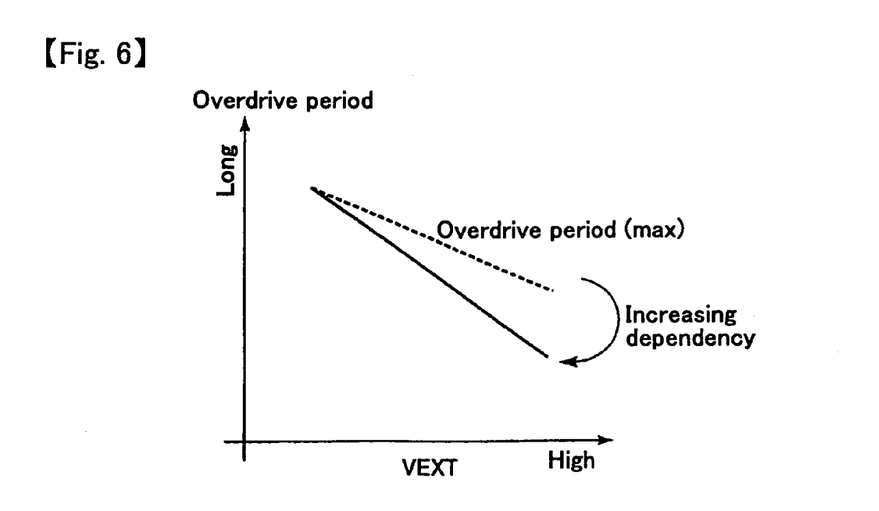
FIG. 6 is a chart showing a relationship between the overdrive period and the external power source voltage.

FIG. 6 shows a relationship between the overdrive period and the external power source voltage. A dashed line indicates the length of the overdrive period of the maximum period (max) for external power source voltage $V_{DD}$. A solid line indicates a case where reference potential $V_{REF}$ and first potential GND_A are variable so as to increase dependency of the overdrive period (max) on external power source voltage $V_{DD}$ and the overdrive period is set to maximum when external power source voltage $V_{DD}$ is low. As is apparent from FIG. 6, when the overdrive period is set to the maximum period, reference potential $V_{REF}$ and first potential GND_A are made variable, thereby further increasing the inverse dependency of the overdrive period on external power source voltage $V_{DD}$.

As described above, according to the overdrive period control device of the first embodiment, since the inverse dependency of the overdrive period on the external power source voltage can be adjusted, the adjustment range of the overdrive period is still larger than the conventional adjustment range using the inverter property. According to this operation, sufficient adjustment can be provided over the operating range of the product.

Further, in the overdrive period control device according to the first embodiment, the overdrive period is determined by a delay time generated by the delay timer including capacitance (C) and resistance (R). This delay time (overdrive period) is determined by the time constant of the delay time (CR circuit) regardless of the external power source voltage.

Second Embodiment

Figure 7:
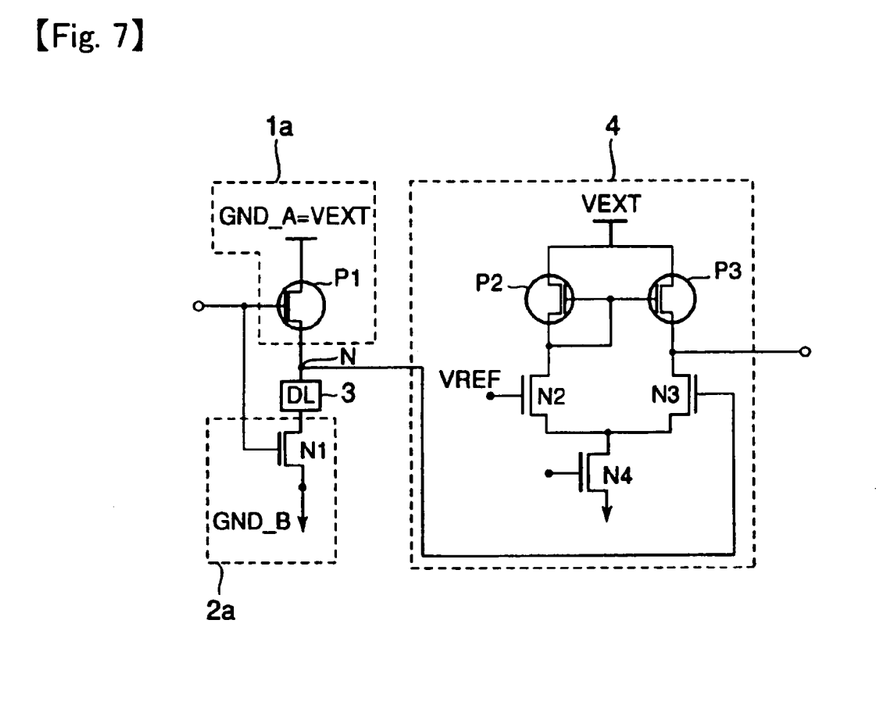
FIG. 7 is a block diagram showing a schematic configuration of a delay timer in an overdrive period control device according to a second embodiment of the present invention.

FIG. 7 is a block diagram showing a schematic configuration of a delay timer in an overdrive period control device according to the second embodiment of the present invention. This delay timer is similar to that shown in FIG. 1 except for the pre-charge circuit, the charge circuit, and node N.

Referring to FIG. 7, pre-charge circuit 1a includes p-channel MOS transistor P1 in which node N which is to be a detection position for a potential level is connected to one terminal and first potential GND_A (i.e., external power source voltage $V_{EXT}$) is supplied to the other terminal. Timing signal T is supplied to a gate of p-channel MOS transistor P1.

Discharge circuit 2a is able to discharge the potential at node N to second potential GND_B ($<V_{EXT}$) via delay element 3 and includes n-channel MOS transistor N1 in which node N is connected to one terminal via delay element 3 and in which second potential GND_B is supplied to the other terminal. Timing signal T is also supplied to the gate of n-channel MOS transistor N1.

Delay element 3 is similar to that explained in the first embodiment and includes a time constant circuit having a resistance and a capacitance. Comparison circuit 4 also is basically similar to that explained in the first embodiment, however, reference potential $V_{REF}$ is set between first potential GND_A and second potential GND_B. In this comparison circuit 4, the output signal is changed to the high level state at the timing where potential $V_N$ at node N reaches reference potential $V_{REF}$.

In the above-described delay timer, during period L in which timing signal T is at the low level, n-channel MOS transistor N1 is OFF and p-channel MOS transistor P1 is ON. When p-channel MOS transistor P1 is ON, node N is pre-charged to first potential GND_A.

On the other hand, during period H in which timing signal T is at the high level, n-channel MOS transistor N1 is ON and p-channel MOS transistor P1 is OFF. When n-channel MOS transistor N1 is ON, electrical charges accumulated at node N are discharged via delay element 3 and potential $V_N$ at node N lowers gradually. When potential $V_N$ at node N reaches reference potential $V_{REF}$, n-channel MOS transistor N3 is OFF and the output from comparison circuit 4 is changed from the low level to the high level.

The overdrive period control device according to the second embodiment is characterized in that the overdrive period is determined by the above-described delay timer.

Figure 8:
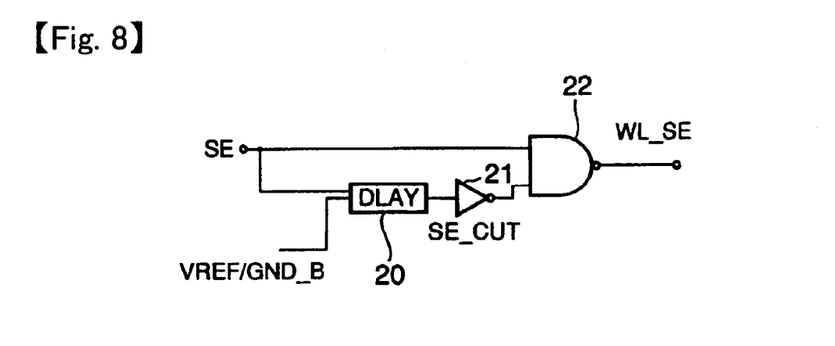
FIG. 8 is a circuit diagram showing the overdrive period control device according to the second embodiment of the present invention.

FIG. 8 shows a configuration of the overdrive period control device according to the second embodiment of the present invention. The overdrive period control device uses timing signal SE as an input to start the sense amplifier circuit in DRAM. Timing signal SE is supplied to one input of delay timer 20 and to one input of logic circuit (NAND) 22. Output signal SE_CUT from delay timer 20 is supplied to the other input of logic circuit (NAND) 22 via logic circuit (NOT) 21. Delay timer 20 is configured similarly to that shown in FIG. 7. The output from logic circuit (NAND) 22 is used as sense timing in DRAM. Here, the sense timing is specifically a period (WL-SE period) from selecting word line WL to output desired data from a memory cell to a bit line, to enabling to reading out the output desired data from the bit line.

Figure 9:
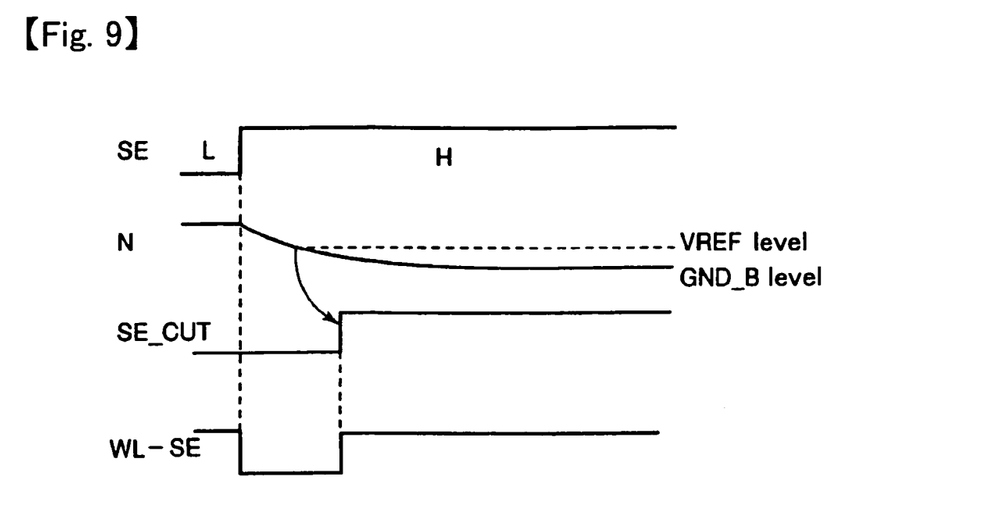
FIG. 9 is a timing chart for explaining an operation of the overdrive period control device shown in FIG. 8.

FIG. 9 is a timing chart showing the operation of the overdrive period control device shown in FIG. 8. The operation is explained below with reference to FIGS. 7, 8, and 9.

Timing signal SE is supplied to delay timer 20. In delay timer 20, while timing signal SE is at the low level, p-channel MOS transistor P1 is ON and n-channel MOS transistor N1 is OFF. When p-channel MOS transistor P1 is ON, node N is pre-charged to first potential GND_A. FIG. 9 shows a state in which potential $V_N$ at node N reaches first potential GND_A.

Since n-channel MOS transistor N3 is ON while timing signal SE is at the low level, the output from comparison circuit 4, namely, output signal SE_CUT from delay timer 20 is at the low level. Further, since timing signal SE is at the low level, the WL-SE signal is at the high level.

When timing signal SE is changed from the low level to the high level, p-channel MOS transistor P1 is OFF and n-channel MOS transistor N1 is ON. When n-channel MOS transistor N1 is ON, potential $V_N$ at node N lowers gradually from first potential GND_A and then reaches reference potential $V_{REF}$.

Since n-channel MOS transistor N3 is ON during the period until potential $V_N$ at node N reaches reference potential $V_{REF}$, the output (output signal SE_CUT) from comparison circuit 4 is at the low level. Also, since timing signal SE is at the high level and output signal SE_CUT is at the low level during this period, the WL-SE signal is at the low level.

When potential $V_N$ at node N reaches reference potential $V_{REF}$, n-channel MOS transistor N3 is OFF and the output (output signal SE_CUT) from comparison circuit 4 is changed from the low level to the high level. When output signal SE_CUT is at the high level, the WL-SE signal changes from the low level to the high level.

With this operation, when first potential GND_A (external power source voltage) in pre-charge is high, the amount of charge to node N increases and it takes longer to discharge at node N accordingly. As a result, the WL-SE period (the period in which WL-SE signal is at the low level in FIG. 9) is long. On the other hand, when first potential GND_A (external power source voltage) is low, the amount of charge to node N decreases and the WL-SE period is shorter accordingly. In this way, the WL-SE period and the external power source voltage are in a proportional relationship.

According to the second embodiment, the overdrive period is determined in accordance with the WL-SE period. Here, the direct proportional relationship between the WL-SE period and the external power source voltage, namely, the direct proportional relationship between the overdrive period and the external power source voltage is called dependency of the overdrive period on the external power source voltage. In the second embodiment, with this dependency, the overdrive period is adjusted and the setting value of reference potential $V_{REF}$ is changed, and thus the dependency of the overdrive period on the external power source voltage is adjusted. Also, by varying second potential GND_B, the dependency of the overdrive period on the external power source voltage can be adjusted.

As described above, according to the overdrive period control device of the second embodiment, since the dependency of the overdrive period on the external power source voltage can be adjusted, the adjustment range of the overdrive period is still larger than the conventional adjustment range using the inverter property. With this operation, sufficient adjustment can be provided over the operating range of the product.

Further, in the overdrive period control device according to the second embodiment, the overdrive period is determined by a delay time generated by the delay timer including capacitance (C) and resistance (R). This delay time (overdrive period) is determined by the time constant of delay time (CR circuit) regardless of the external power source voltage.

Figure 10:
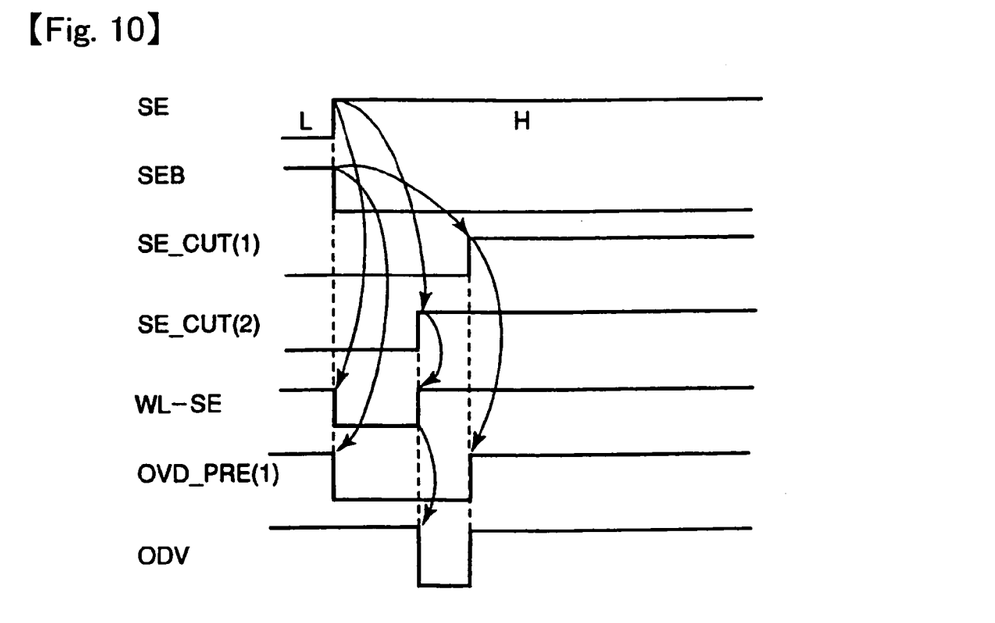
FIG. 10 is a timing chart for explaining an operation of an overdrive period control device according to another embodiment of the present invention.

The overdrive period control device according to each of the above-described embodiments is one example, and the configuration and the operation thereof can be changed as appropriate. For example, the configuration of the first embodiment and the configuration of the second embodiment may be combined to configure an overdrive period control device. FIG. 10 shows a timing chart of the overdrive period control device.

In FIG. 10, SE_CUT (1) and OVD_PRE (1) are equal to SE_CUT and ODV shown in FIG. 3A or 3B. SE_CUT (2) and WL-SE are equal to SE_CUT and WL-SE shown in FIG. 8. ODV is a logic output (or NAND) of the inverse signal of OVD_PRE (1) and the signal of WL-SE.

According to the operation shown in FIG. 10, the overdrive period is determined by subtracting the delay time of the delay timer according to the second embodiment from the delay time of the delay timer according to the first embodiment. The reference potential and first potential GND_A according to the first embodiment are varied, and thus the inverse dependency of the overdrive period on the external power source voltage can be adjusted. The reference potential and second potential GND_B according to the second embodiment are varied, and thus the dependency of the overdrive period on the external power source voltage can be adjusted. Accordingly, the overdrive period can be adjusted in further detail at the lower side and the higher side of the power source voltage over the operating range of the product.

Further, in the first and second embodiments, delay element 3 may be configured in any circuit so long as it is a CR circuit. For example, delay element 3 may be formed from memory cell capacitance (C) and MOS transistor (R). Dummies are respectively provided for p-channel MOS transistor of the sense amplifier and the driving circuit, and these dummies are used as delay element 3.

Also, there is no limitation that applies to comparison circuit 4 shown in the drawings, and it may be configured in any circuit, as long as it can detect timing in which the potential at node N reaches the reference potential.

Figure 11:
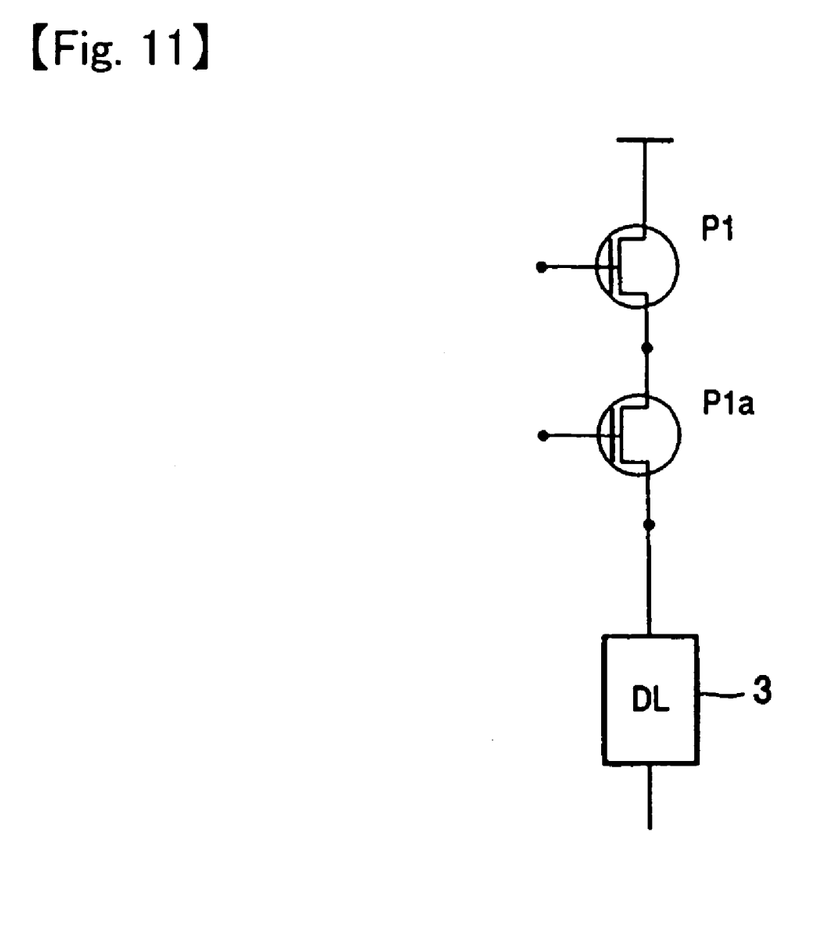
FIG. 11 is a circuit diagram showing a modified example of the overdrive period control device shown in FIG. 1.

According to the first embodiment, as shown in FIG. 11, p-channel MOS transistor Pa for current control may be provided between p-channel MOS transistor P1 and delay element 3. With this series structure of p-channel MOS transistors, it is possible to keep the current flowing through delay element 3 constant and to accurately calculate the overdrive period based on the time constant.

Further, according to the first embodiment, node N is pre-charged by first potential GND_A, however, a feedback circuit for varying first potential GND_A in accordance with $\Delta V$ ($V_{EXT}$-$V_{REF}$) may be provided. In this case, when $\Delta V$ ($V_{EXT}$-$V_{REF}$) is large, first potential GND_A is made high and the inverse dependency of the overdrive period on the external power source voltage can be further strengthened. The feedback circuit may be a general source follower circuit using $\Delta V$ ($V_{EXT}$-$V_{REF}$) converted by a general differential absolute value circuit as an input.

Figure 12:
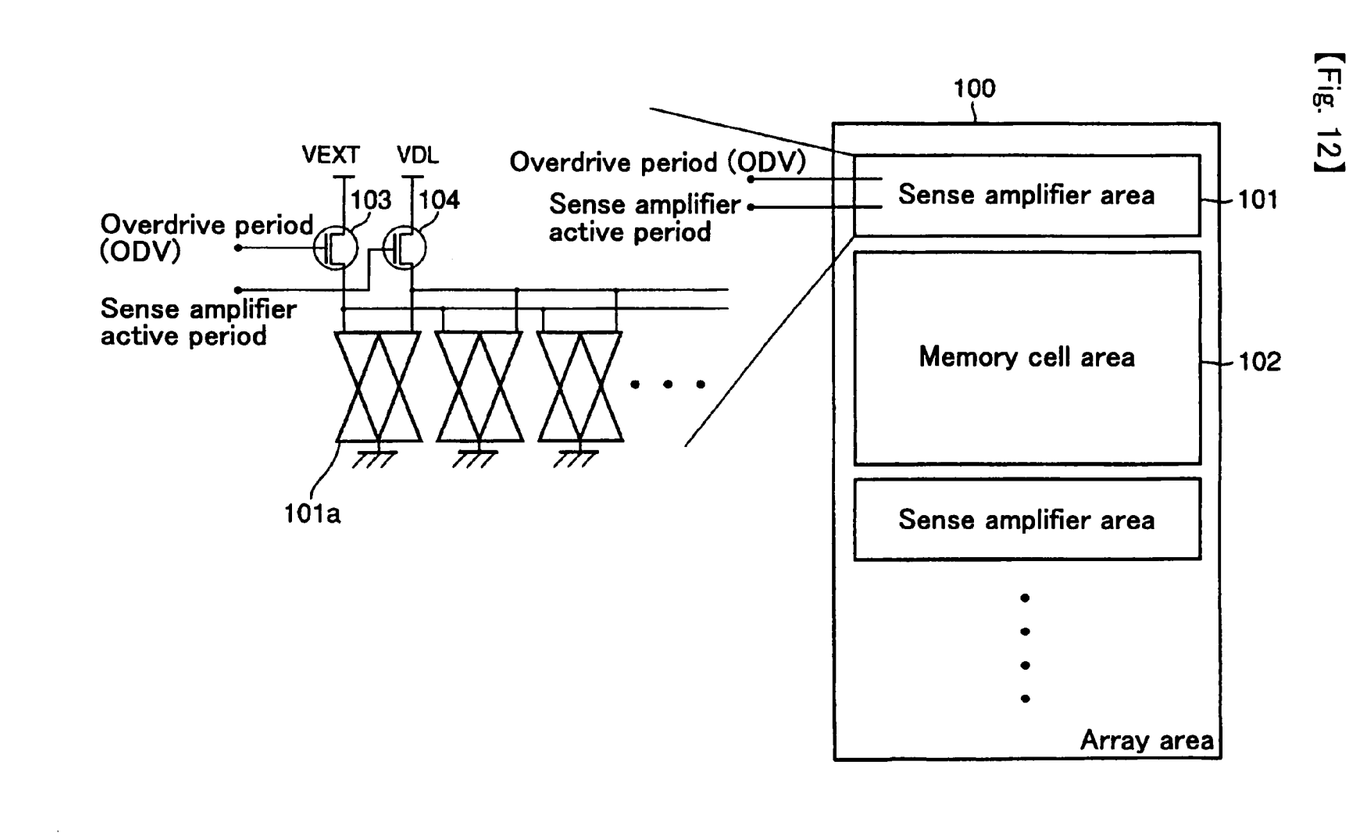
FIG. 12 is a block diagram showing one example of DRAM to which the overdrive period control device is applied.

Next, the configuration of DRAM to which the overdrive period control device of the present invention is applied, will be explained. FIG. 12 shows the schematic configuration of DRAM.

Referring to FIG. 12, sense amplifier area 101 where a plurality of sense amplifiers 101a is formed and memory cell area 102 where a plurality of memory cells is formed are provided on semiconductor substrate 100. To each sense amplifier 101a, external power source voltage $V_{EXT}$ is supplied via p-channel MOS transistor 103 and internal array voltage $V_{DL}$ is supplied via p-channel MOS transistor 104. Overdrive signal ODV output from the overdrive period control device (not shown) of the present invention is supplied to the gate of p-channel MOS transistor 103. Timing signal SE for driving the sense amplifier. (sense amplifier active period) is supplied to the gate of p-channel MOS transistor 104. In the example shown in FIG. 12, the period, in which the overdrive for sense amplifier 101a is directly performed to use external power source voltage $V_{EXT}$, is determined by the overdrive period control device according to the present invention.

Figure 13:
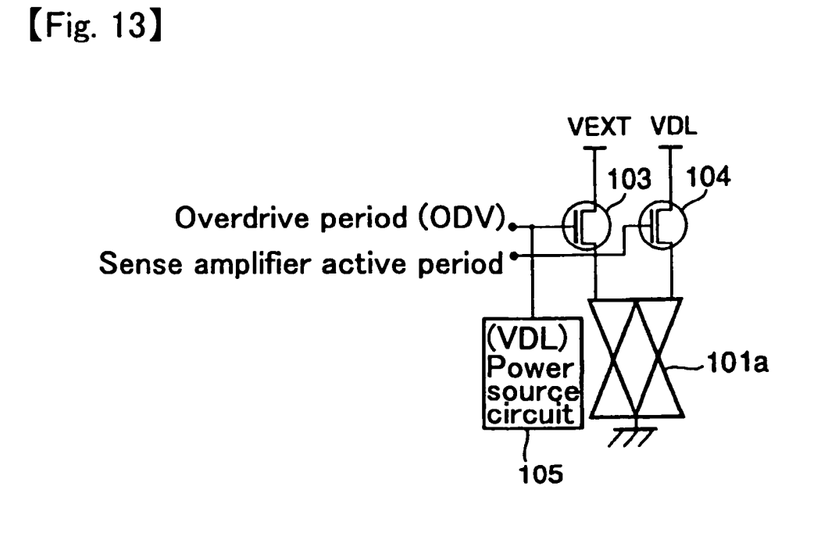
FIG. 13 is a schematic view showing an applied example of the overdrive period control device according to the present invention.
Figure 14:
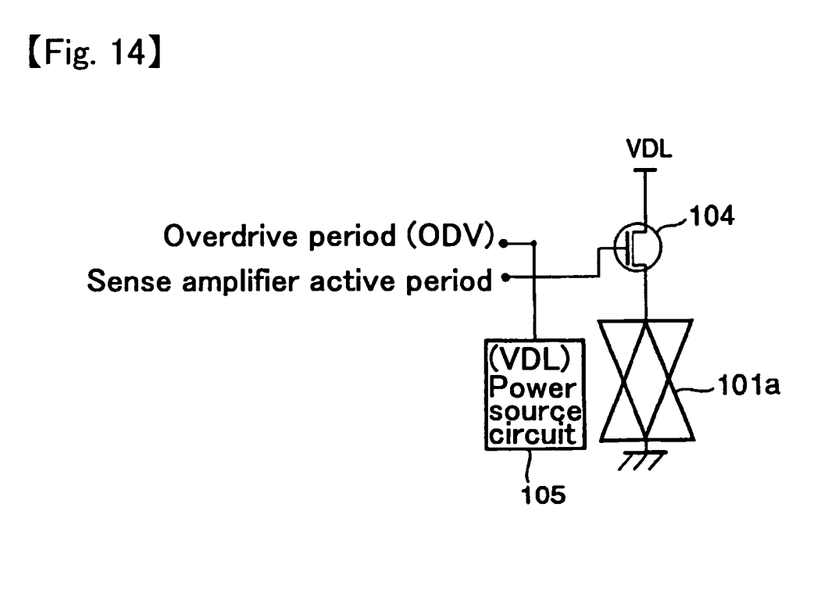
FIG. 14 is a schematic view showing an applied example of the overdrive period control device.
Figure 15:
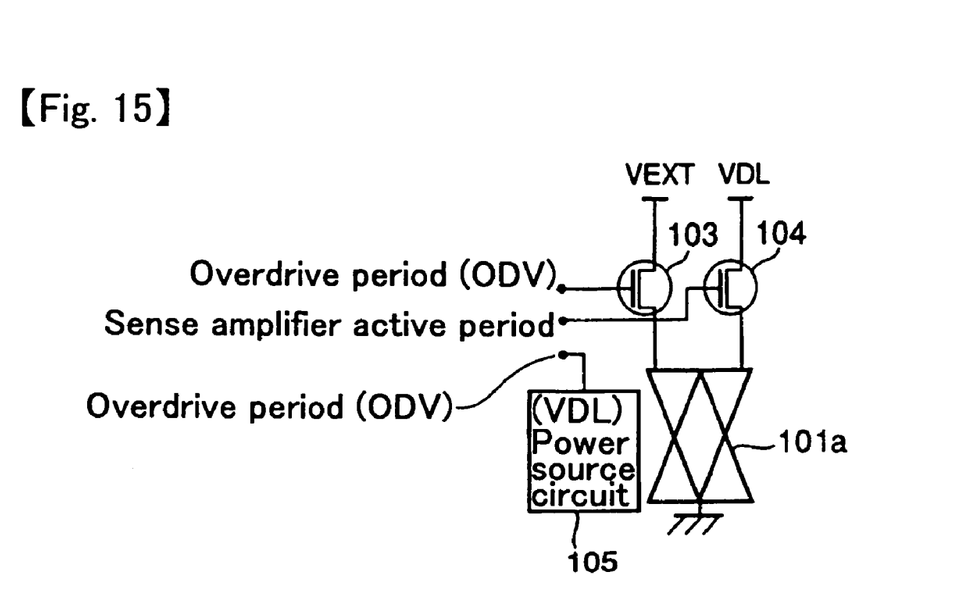
FIG. 15 is a schematic view showing an applied example of the overdrive period control device.

Further, there are various configurations for performing the overdrive operation in DRAM, and the overdrive period control device according to the present invention may be applied to various overdrive configurations. FIGS. 13 to 15 show applied examples of the overdrive period control device according to the present invention.

In the example shown in FIG. 13, the period for directly overdriving sense amplifier 101a and the period for overdriving internal array power source circuit 105 are determined by the overdrive period control device according to the present invention. In the example shown in FIG. 14, the period for overdriving internal array power source circuit 105 is determined by the overdrive period control device according to the present invention. In the example shown in FIG. 15, the period for directly overdriving sense amplifier 101a and the period for overdriving internal array power source circuit 105 are determined separately by the overdrive period control device according to the present invention.

While preferred embodiments of the present invention have been described using specific terms, such description is for illustrative purposes only, and it is to be understood that changes and variations may be made without departing from the spirit or scope of the following claims.

What is claimed is:

1. An overdrive period control device comprising:
   a pre-charge circuit connected to a node on which a potential level is detected and for raising a potential at the node to a first potential;
   a delay element one terminal of which is connected to the node;
   a charge circuit for supplying a power source voltage to the other terminal of said delay element at an input timing of a signal from an outside and for raising the potential at the node, which has been already raised to the first potential, to the power source voltage;
   a comparison circuit for comparing the potential at the node with a reference potential that is larger than the first potential and smaller than the power source voltage and for detecting a timing at which both levels of the potentials coincide; and
   a logic circuit outputting a signal indicating a period determined by the input timing of the signal from the outside and the timing in which said comparison circuit detects that both levels of the potentials coincide.

2. The overdrive period control device according to claim 1, further comprising:
   a feedback circuit for supplying a difference between the power source voltage and the reference potential as the first potential to said pre-charge circuit.

3. An overdrive period control device comprising:
   a pre-charge circuit for supplying a power source voltage to a node on which a potential level is detected and for raising a potential at the node to the power source voltage;
   a delay element one terminal of which is connected to the node;
   a discharge circuit for supplying a second potential to the other terminal of said delay element at an input timing of a signal from an outside and for lowering the potential at the node, which has been already raised to the power source voltage, to the second potential;
   a comparison circuit for comparing the potential at the node with a reference potential that is larger than the second potential and smaller than the power source voltage and for detecting a timing at which both levels of the potentials coincide; and
   a logic circuit for outputting a signal indicating a period determined by the input timing of the signal from the outside and the timing in which said comparison circuit detects that both levels of the potential coincide.

4. An overdrive period control device comprising:
   a first pre-charge circuit connected to a first node on which a potential level is detected and for raising a potential at the first node to a first potential;
   a first delay element one terminal of which is connected to the first node;
   a charge circuit for supplying a power source voltage to the other terminal of said first delay element at an input timing of a signal from an outside and for raising the potential at the first node, which has been already raised to the first potential, to the power source voltage;

a first comparison circuit for comparing the potential at the first node with a first reference potential that is larger than the first potential and smaller than the power source voltage and for detecting a first timing at which both levels of the potentials coincide;

a second pre-charge circuit for supplying the power source voltage to a second node on which a potential level is detected and for raising a potential at the second node to the power source voltage;

a second delay element of which one terminal is connected to the second node;

a discharge circuit for supplying a second potential to the other terminal of said second delay element at the input timing of the signal from the outside and for lowering the potential at the second node, which has been already raised to the power source voltage, to the second potential;

a second comparison circuit comparing the potential at the second node with a second reference potential that is larger than the second potential and smaller than the power source voltage and for detecting a second timing at which both levels of the potentials coincide; and a logic circuit for outputting a signal indicating a period determined by subtracting a second period, which is determined by the input timing of the signal from the outside and the second timing, from a first period which is determined by the input timing of the signal from the outside and by the first timing.

5. The overdrive period control device according to claim 4, further comprising:

a feedback circuit for supplying a difference between the power source voltage and the first reference potential as the first potential to said first pre-charge circuit.

6. An overdrive period determining method comprising the steps of:

performing pre-charge to raise a potential at a node on which a potential is detected to a first potential;

after the pre-charge, supplying a power source voltage to the node at an input timing of a signal from an outside via a delay element and raising the potential at the node, which has been already raised to the first potential, to the power source voltage;

comparing the potential at the node with a reference potential that is larger than the first potential and smaller than the power source voltage and detecting a timing at which both levels of the potentials coincide; and determining an overdrive period in accordance with a period determined by the input timing of the signal from the outside and the timing in which it is detected that both levels of the potentials coincide.

7. An overdrive period determining method comprising the steps of:

performing pre-charge to supply a power source voltage to a node on which a potential is detected and for raising a potential at the node to the power source voltage;

after the pre-charge, supplying a second potential to the node at an input timing of a signal from an outside via a delay element and lowering the potential at the node, which has been already raised to the power source voltage, to the second potential;

comparing the potential at the node with a reference potential that is larger than the second potential and smaller than the power source voltage and detecting a timing at which both levels of the potentials coincide; and determining an overdrive period in accordance with a period determined by the input timing of the signal from the outside and the timing in which it is detected that both levels of the potentials coincide.

8. An overdrive period determining method comprising the steps of:

performing first pre-charge to raise a potential at a first node on which a potential level is detected, to a first potential;

after the first pre-charge, supplying a power source voltage to the first node at an input timing of a signal from an outside via a first delay element and raising the potential at the first node, which has been already raised to the first potential, to the power source voltage;

comparing the potential at the first node with a first reference potential that is larger than the first potential and smaller than the power source voltage and detecting a first timing at which both levels of the potentials coincide;

performing second per-charge to supply a power source voltage to a second node on which a potential level is detected, and to raise a potential at the second node to the power source voltage;

after the second pre-charge, supplying a second potential to the second node at the input timing of the signal from the outside via a second delay element and lowering the potential at the second node, which has been already raised to the power source voltage, to the second potential;

comparing the potential at the second node with a second reference potential that is larger than the second potential and smaller than the power source voltage and detecting a second timing at which both levels of the potentials coincide; and determining an overdrive period in accordance with a period obtained by subtracting a second period, which is determined by the input timing of the signal from the outside and the second timing, from a first period which is determined by the input timing of the signal from the outside and by the first timing.

* * * * *